United States Patent
Do et al.

(10) Patent No.: US 8,098,074 B2
(45) Date of Patent: Jan. 17, 2012

(54) MONITORING CIRCUIT FOR SEMICONDUCTOR DEVICE

(75) Inventors: Chang-Ho Do, Gyeonggi-do (KR); Jae-Hyuk Im, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 461 days.

(21) Appl. No.: 12/345,649

(22) Filed: Dec. 29, 2008

(65) Prior Publication Data
US 2009/0303650 A1    Dec. 10, 2009

(30) Foreign Application Priority Data
Jun. 10, 2008    (KR) .................. 10-2008-0054211

(51) Int. Cl.
*H01H 85/30* (2006.01)
*G01R 31/02* (2006.01)
(52) U.S. Cl. ........................... 324/550; 361/104
(58) Field of Classification Search .................. 324/550, 324/537, 500; 361/104, 626, 628, 833, 837
See application file for complete search history.

(56) References Cited

U.S. PATENT DOCUMENTS

| | | | |
|---|---|---|---|
| 4,288,739 A * | 9/1981 | Nercessian | 323/275 |
| 5,291,139 A * | 3/1994 | Fruhauf et al. | 324/550 |
| 5,935,253 A | 8/1999 | Conary et al. | |
| 6,226,211 B1 | 5/2001 | Kwak et al. | |
| 6,640,198 B2 | 10/2003 | Miyazaki et al. | |
| 6,757,857 B2 | 6/2004 | Lamb et al. | |
| 7,573,273 B2 * | 8/2009 | Yanagida | 324/550 |
| 7,701,226 B2 * | 4/2010 | Kaneko | 324/550 |
| 2004/0051553 A1 | 3/2004 | Manna et al. | |
| 2006/0080058 A1 | 4/2006 | Zimmerman et al. | |

FOREIGN PATENT DOCUMENTS

| | | |
|---|---|---|
| JP | 11-096795 | 4/1999 |
| JP | 2007-324173 | 12/2007 |
| KR | 1020070109107 A | 11/2007 |

OTHER PUBLICATIONS

Notice of Preliminary Rejection issued from Korean Intellectual Property Office on Sep. 25, 2009 with an English Translation.

* cited by examiner

*Primary Examiner* — Hoai-An D Nguyen
(74) *Attorney, Agent, or Firm* — IP & T Group LLP

(57) ABSTRACT

Provided is a technology for monitoring the electrical resistance of an element such as a fuse whose resistance is changed due to the electrical stress among internal circuits included in a semiconductor device. The present invention provides a monitoring circuit to monitor the change in the device specification during the device is being programmed and after the device is programmed. The present invention enables the verification of an optimized condition to let the device have a certain electrical resistance, by comparing the load voltage and the fuse voltage with the reference voltage that can sense the range of resistance variation more precisely. Also, it can guarantee device reliability since it is still possible to sense electrical resistance after the electrical stress is being given. Also, the present invention can increase the utility of the fuse by possessing an output to monitor electrical resistance sensed inside of the semiconductor.

14 Claims, 11 Drawing Sheets

MONITORING CIRCUIT FOR SEMICONDUCTOR DEVICE

CROSS-REFERENCE TO RELATED APPLICATIONS

The present invention claims priority of Korean patent application number 10-2008-0054211, filed on Jun. 10, 2008, which is incorporated by reference in its entirety.

BACKGROUND OF THE INVENTION

The present invention relates to a semiconductor design technology, and more particularly, to a technology for monitoring the electrical resistance of an element such as a fuse whose resistance changes due to the electrical stress among internal circuits included in a semiconductor device.

As the highly-integrated technology of a semiconductor memory device is developed, the number of memory cells and signal lines included in a single semiconductor memory device has been rapidly increased, and line width is narrowed and the size of a memory cell is getting smaller since the memory cells and signal lines are integrated in a limited area. Due to the above-mentioned reasons, the possibility of having a defective memory cell in the semiconductor memory device is increased; however, although there may be a defective memory cell, the semiconductor memory device having an expected capacity can still be manufactured with a high production yield because there is a redundancy circuit included in the semiconductor memory device for remedying the defective memory cell. The redundancy circuit includes a fuse or the like for programming a repair address which corresponds to a redundancy memory cell and a defective memory cell. Generally, if a wafer process is completed, various testes are performed and repairable defective memory cells among detected defective memory cells are remedied by replacing those cells with redundancy memory cells. That is, an internal circuit performs a programming for changing an address which corresponds to a defective memory cell with an address which corresponds to a redundancy memory cell. Accordingly, if the address which corresponds to the defective memory cell is inputted, the defective memory cell is replaced with the redundancy memory cell so that a normal operation is performed. For programming address information which corresponds to the defective memory cell, a fuse programming method is mostly used. In case of applying a laser beam or an electrical stress to the fuse, the electrical characteristic of the fuse is changed, and thus the electrical resistance is changed. By using this electrical connection state of the fuse, an address is programmed.

A laser blowing-type fuse which disconnects the connection state of the fuse by using the laser beam is generally called a physical fuse type and is performed in a wafer state. Herein, the wafer state is a step prior to the step in which the semiconductor memory device is manufactured to a package. In the package state, an electrical method is used instead of the physical method which uses the laser. A fuse which is programmable in the package state is generally called an electrical fuse, which means that a programming is possible by changing the electrical connection of the fuse by applying the electrical stress. Such an electrical fuse can be classified into one of two types: an anti-type fuse which changes an open state to a short state, or an blowing-type fuse which changes the short state to the open state. The utility of the above-mentioned electrical fuse is very high in the package state since the electrical fuse is used for programming after packaging.

Since the programming of the electrical fuse is performed in the package state, it is difficult to visually detect the characteristics change and electrical connection of the fuse while the programming is performed, and it is possible to detect the state of the fuse by testing an operation of the semiconductor device after the programming. Furthermore, since the electrical stress applied to the fuse while the programming is in progress is higher than an electrical applying condition for a general operation, a deterioration of the device characteristics may occur. Therefore, it is important to find an optimum condition for stably programming the fuse in order to effectively use the electrical fuse; however, it is very difficult to find the optimized programming condition in batches by reflecting different process conditions of semiconductor devices. Therefore, when a device such as the fuse which stores information according to the electrical connection state, it is required to correctly find an optimum applying condition for changing its resistance to a predetermined electrical resistance.

SUMMARY OF THE INVENTION

The present invention has been proposed in order to overcome the above-described problems in the background of the present invention. Embodiments of the present invention are directed to providing a monitoring circuit capable of detecting characteristics change of a device such as a fuse while the device is programmed to find an optimum applying condition for programming the device. Furthermore, embodiments of the present invention are directed to providing a monitoring circuit capable of detecting the characteristics change of the device even after the device is programmed.

In accordance with an aspect of the present invention, there is provided a monitoring circuit of a semiconductor device, which includes: a programmable loading unit, whose electrical resistance is changed according to an applied electrical stress, configured to output a load voltage corresponding to the electrical resistance; a reference voltage generating unit configured to generate a predetermined reference voltage; and a comparing unit configured to detect a change of the electrical resistance of the programmable loading unit and output a load detection signal by comparing the load voltage with the reference voltage.

In accordance with another aspect of the present invention, there is provided a monitoring circuit of a semiconductor device, which includes: a fuse unit, which is provided with an anti-fuse whose electrical resistance is changed according to an applied electrical stress, configured to output a fuse voltage corresponding to the electrical resistance of the anti-fuse and a fuse state signal corresponding to an electrical connection state of the anti-fuse; a reference voltage generating unit configured to generate a predetermined reference voltage; a comparing unit configured to detect a change of the electrical resistance of the anti-fuse and output a load detection signal by comparing the fuse voltage with the reference voltage; and an output unit configured to output the load detection signal and the fuse state signal to an output pad.

The present invention monitors the change in the characteristic of programmable loading unit and the fuse unit both while applying electrical stress and after the electrical stress is applied to find optimized condition for programming. That present invention verifies optimized condition to let the device have a certain electrical resistance by comparing the load voltage and the fuse voltage with the reference voltage that can sense the range of resistance variation precisely. Also, it can guarantee device reliability since it is still possible to sense electrical resistance after the electrical stress is being given. Also, the present invention can increase the utility of the fuse by possessing an output to monitor electrical resistance sensed inside of the semiconductor. The present invention can also increase programming utility by lump-process of programming based on the understood optimized condition. The present invention provides a monitoring circuit to monitor the change in the characteristic during the device is being programmed and after the device is programmed.

DESCRIPTION OF SPECIFIC EMBODIMENTS

In order to describe in detail such that those skilled in the art can easily implement the spirit and scope of the present invention, the embodiments of the present invention will be described with reference to the accompanying drawings.

Generally, a logic signal of a circuit is defined as having a high level or a low level, which is represented as '1' and '0' respectively, corresponding to the voltage level. Also, it is defined and described that the logic signal may additionally have a high impedance (HI-Z) state according to the need. Furthermore, P-channel Metal Oxide Semiconductor (PMOS) and N-channel Metal Oxide Semiconductor (NMOS) are used in the embodiments of the present invention as Metal Oxide Semiconductor Field-Effect Transistor (MOSFET).

Figure 1:
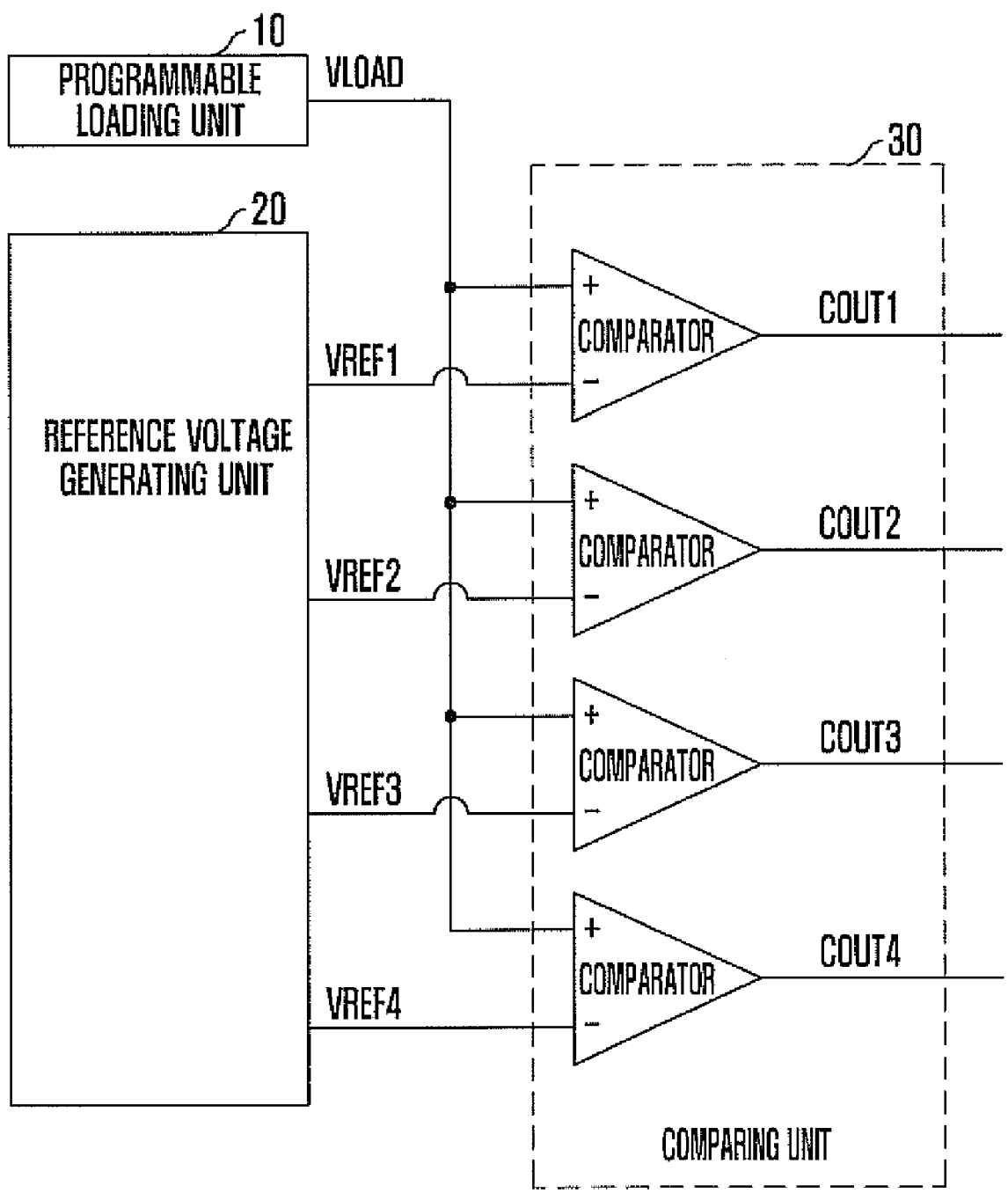
FIG. 1 is a block diagram depicting a monitoring circuit in accordance with a first embodiment of the present invention.

FIG. 1 is a block diagram depicting a monitoring circuit in accordance with a first embodiment of the present invention.

Referring to FIG. 1, the monitoring circuit of a semiconductor device includes a programmable loading unit 10 whose electrical resistance is changed according to an applied electrical stress for outputting a load voltage VLOAD corresponding to the electrical resistance; a reference voltage generating unit 20 for generating a predetermined plurality of reference voltages VREF1 to VREF4; and a comparing unit 30 for detecting a change of the electrical resistance of the programmable loading unit 10 and outputting a plurality of load detection signals COUT1 to COUT4 by comparing the load voltage VLOAD to the plurality of reference voltages VREF1 to VREF4.

An operation of the monitoring circuit of the semiconductor device constructed as mentioned above is described as below.

If the electrical stress is applied adjusting a bias voltage and a bias time, the electrical resistance of the programmable loading unit 10 is changed according to the applied electrical stress. At the same time, the load voltage VLOAD generated by an applied bias voltage and a changed electrical resistance is outputted. The reference voltage generating unit 20 generates the predetermined plurality of reference voltages VREF1 to VREF4 by predicting a changing range of the load voltage VLOAD. The comparing unit 30 outputs the plurality of load detection signals COUT1 to COUT4 by comparing the load voltage VLOAD with the plurality of reference voltages VREF1 to VREF4. Since the level of the load voltage VLOAD is changed according to the electrical resistance of the programmable loading unit 10, the value of the electrical resistance of the programmable loading unit 10 can be monitored through the plurality of load detection signals COUT1 to COUT4 which is a result of detecting the level of the load voltage VLOAD.

Although four reference voltages are generated to be compared with the load voltage VLOAD in the above-mentioned embodiment, the number of the reference voltages can be changed according to a range of electrical resistance required to be detected accurately, and also a single reference voltage can be generated to detect the electrical resistance. Also, the programmable loading unit 10 keeps a changed electrical resistance and outputs the load voltage VLOAD even after the electrical stress is removed. Accordingly, the electrical resistance of the programmable loading unit 10 can be monitored even after the programming.

Figure 2:
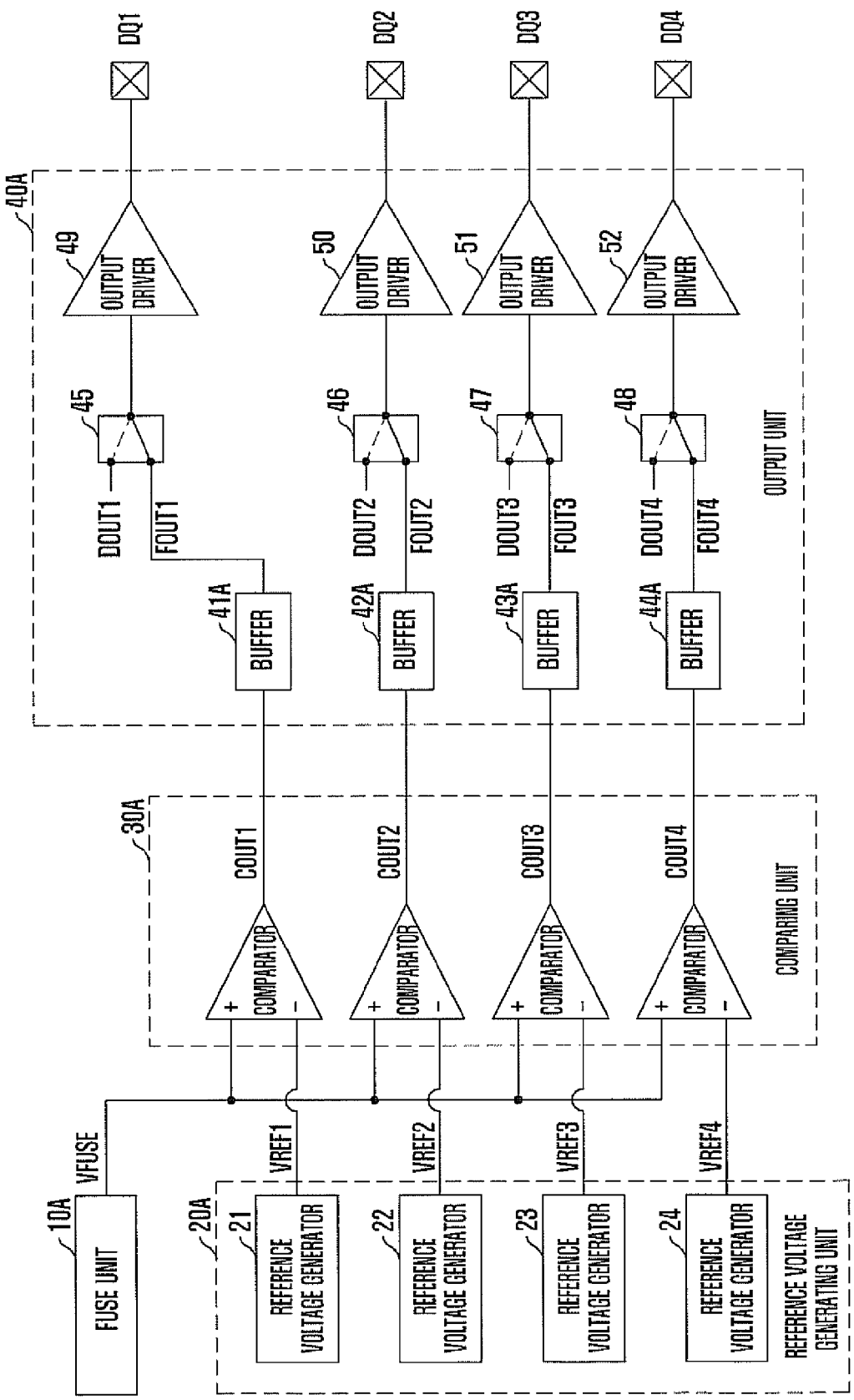
FIG. 2 is a block diagram showing a monitoring circuit in accordance with a second embodiment of the present invention.

FIG. 2 is a block diagram showing a monitoring circuit in accordance with a second embodiment of the present invention.

Referring to FIG. 2, the monitoring circuit of the semiconductor device includes a fuse unit 10A provided with an anti-fuse whose electrical resistance is changed according to an applied electrical stress for outputting a fuse voltage VFUSE corresponding to the electrical resistance of the anti-fuse, a reference voltage generating unit 20A for generating a predetermined plurality of reference voltages VREF1 to VREF4, a comparing unit 30A for detecting a change of the electrical resistance of the anti-fuse and outputting a plurality of load detection signals COUT1 to COUT4 by comparing the fuse voltage VFUSE with the plurality of reference voltages VREF1 to VREF4, and an output unit 40A for outputting the plurality of load detection signals COUT1 to COUT4 to data output pads DQ1 to DQ4.

Also, the reference voltage generating unit 20A includes a plurality of reference loads whose electrical resistance is not changed in spite of an applied electrical stress, wherein each of the reference loads has a different electrical resistance. In order to generate the plurality of reference voltages VREF1 to VREF4 which corresponds to the electrical resistance of each reference load, the reference voltage generating unit 20A includes a plurality of reference voltage generators 21 to 24 which includes each reference load.

Also, the output unit 40A includes buffers 41A to 44A for buffering the plurality of load detection signals COUT1 to COUT4, output selectors 45 to 48 for selectively outputting output data signals DOUT1 to DOUT4 or signals FOUT1 to FOUT4 outputted from the buffers 41A to 44A, and output drivers 49 to 52 for outputting signals outputted from the output selectors 45 to 49 to the data output pads DQ1 to DQ4.

An operation of the monitoring circuit of the semiconductor device constructed as above-mentioned is described as below.

The fuse unit 10A includes the anti-fuse. If the electrical stress is applied to the anti-fuse adjusting a bias voltage and a bias time, the electrical resistance of the anti-fuse is changed according to the applied electrical stress. At the same time, the fuse voltage VFUSE generated by an applied bias voltage and the changed electrical resistance is outputted. The reference voltage generating unit 20A generates the predetermined plurality of reference voltages VREF1 to VREF4 by predicting a changing range of the fuse voltage VFUSE in the plurality of reference voltage generators 21 to 24. Each of the reference voltage generators 21 to 24 includes a reference load, and each reference load has a different electrical resistance. In spite of the same electrical stress applied to the anti-fuse, electrical characteristics of the reference load is not changed, and the reference load outputs the reference voltage generated by an applied bias voltage and a fixed electrical resistance keeping an intrinsic electrical resistance. The comparing unit 30A detects a change of the electrical resistance of the anti-fuse by comparing the fuse voltage VFUSE with the plurality of reference voltages VREF1 to VREF4. The fuse voltage VFUSE has been generated by an applied bias voltage and the electrical resistance of the anti-fuse, and the plurality of reference voltages VREF1 to VREF4 have been generated by an applied bias voltage and the electrical resistance of each reference load. Accordingly, if the applied bias voltage is the same, the change of the electrical resistance of the anti-fuse can be monitored through the plurality of load detection signals COUT1 to COUT4 which are a result of comparing the fuse voltage VFUSE with the plurality of reference voltages VREF1 to VREF4. That is, by referencing the electrical resistance of the plurality of reference loads, the value of the electrical resistance of the anti-fuse can be monitored. Since the output unit 40A outputs the plurality of load detection signals COUT1 to COUT4 to the data output pads DQ1 to DQ4, the value of the electrical resistance of the anti-fuse can be monitored outside of the semiconductor device. The internal operation of the output unit 40A is performed as follows. The buffers 41A to 44A perform a buffering to convert the plurality of load detection signals COUT1 to COUT4 to an appropriate internal signal level. The output selectors 45 to 48 selectively output the output data signals DOUT1 to DOUT4 or the signals FOUT1 to FOUT4 outputted from the buffers 41A to 44A, and the output drivers 49 to 52 output signals outputted from the output selectors 45 to 48 to the outside of the semiconductor device through the data output pads DQ1 to DQ4.

Figure 3:
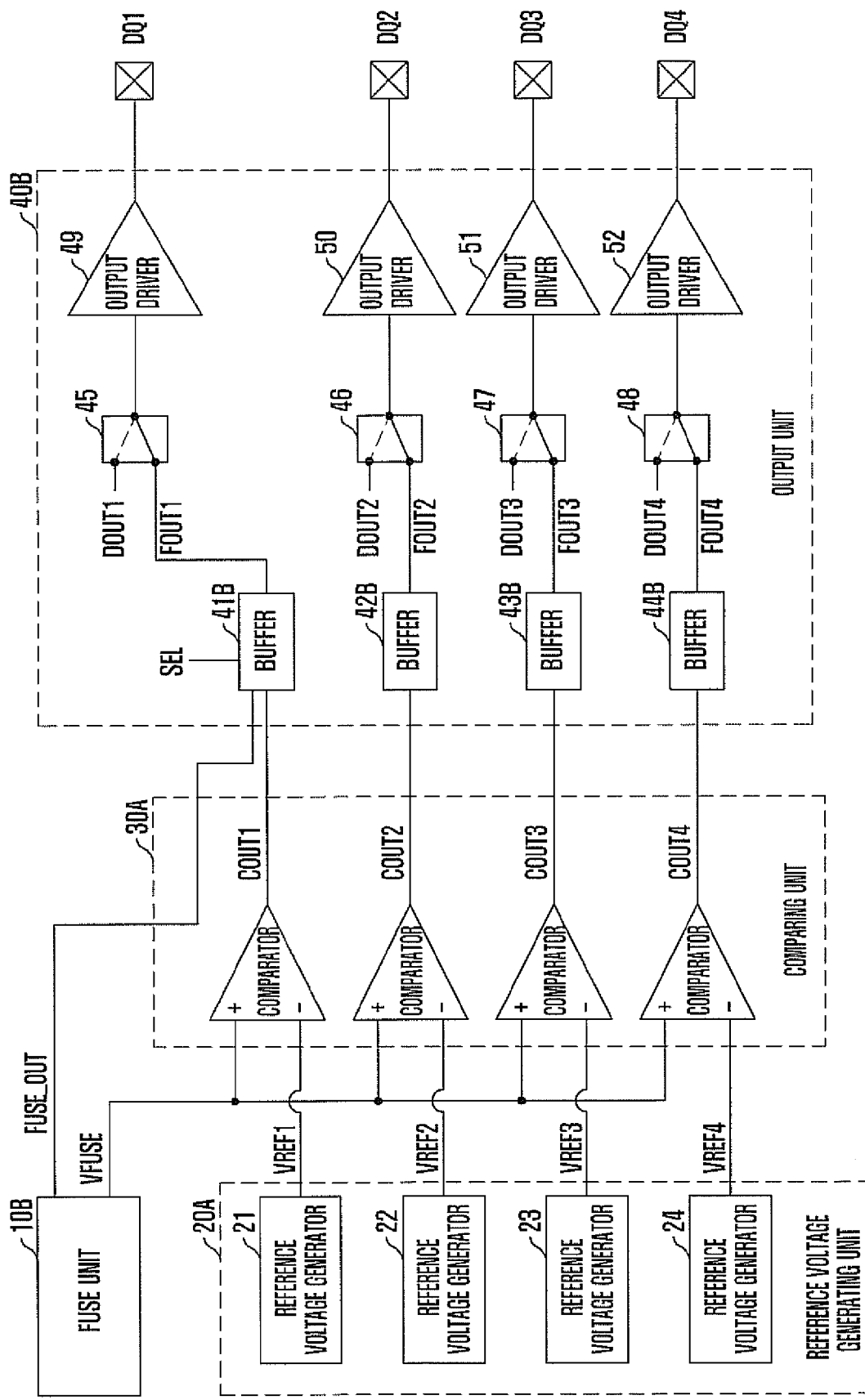
FIG. 3 is a block diagram depicting a monitoring circuit in accordance with a third embodiment of the present invention.

FIG. 3 is a block diagram depicting a monitoring circuit in accordance with a third embodiment of the present invention.

Referring to FIG. 3, the monitoring circuit of the semiconductor device includes a fuse unit 10B provided with an anti-fuse whose electrical resistance is changed according to an applied electrical stress for outputting a fuse voltage VFUSE corresponding to the electrical resistance of the anti-fuse and a fuse state signal FUSE_OUT corresponding to the electrical connection state of the anti-fuse, a reference voltage generating unit 20A for generating a predetermined plurality of reference voltages VREF1 to VREF4, a comparing unit 30A for detecting a change of the electrical resistance of the anti-fuse and outputting a plurality of load detection signals COUT1 to COUT4 by comparing the fuse voltage VFUSE with the plurality of reference voltages VREF1 to VREF4, and an output unit 40B for outputting the plurality of load detection signals COUT1 to COUT4 to data output pads DQ1 to DQ4.

Also, the reference voltage generating unit 20A includes a plurality of reference loads whose electrical resistance is not changed in spite of the applied electrical stress, wherein each of the reference loads has a different electrical resistance. In order to generate the plurality of reference voltages VREF1 to VREF4 each corresponding to the electrical resistance of a reference load, the reference voltage generating unit 20A includes a plurality of reference voltage generators 21 to 24 each including a reference load.

Also, the output unit 40B includes buffers 41B to 44B for buffering the plurality of load detection signals COUT1 to COUT4 and the fuse state signal FUSE_OUT, output selectors 45 to 48 for selectively outputting output data signals DOUT1 to DOUT4 or signals FOUT1 to FOUT4 outputted from the buffers 41B to 44B, and output drivers 49 to 52 for outputting signals outputted from the output selectors 45 to 49 to the data output pads DQ1 to DQ4.

An operation of the monitoring circuit constructed as mentioned above is basically the same as that of the monitoring circuit shown in FIG. 2. The fuse unit 10B stores address information or the like into the anti-fuse according to the fuse state signal FUSE_OUT which corresponds to the electrical connection state of the anti-fuse. The output unit 40B has been reconfigured for outputting the fuse state signal FUSE_OUT through the data output pad DQ1. While the data output pad DQ1 for outputting the fuse state signal FUSE_OUT is constructed to be shared with the load detection signal COUT1 in accordance with the third embodiment, the fuse state signal FUSE_OUT can be outputted to the outside of the semiconductor device through an extra output pad.

Hereafter, components of the above-mentioned monitoring circuit will be explained in detail.

Firstly, the fuse units 10A and 10B are described in detail as follows.

Figure 4A:
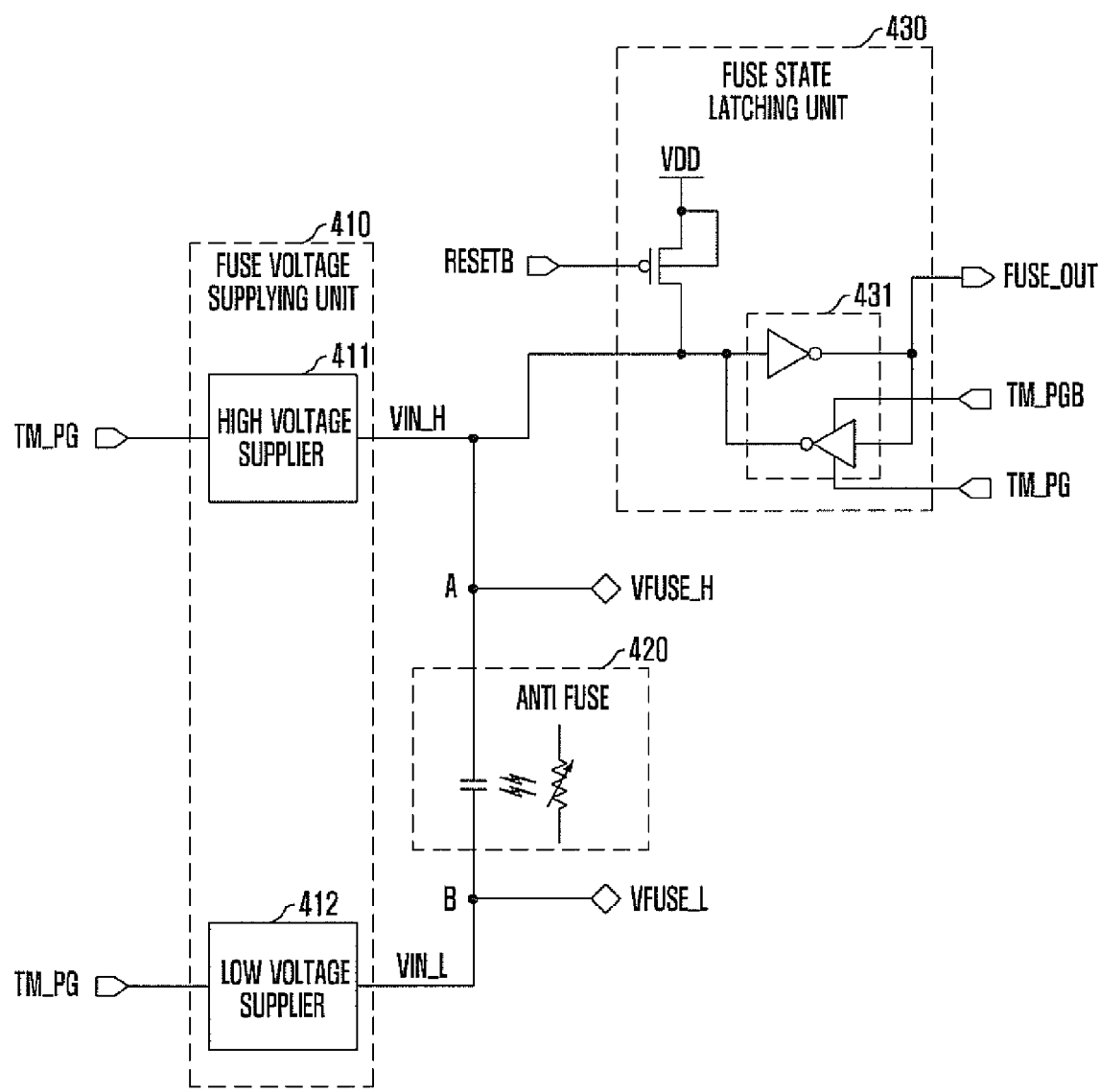
FIG. 4A is a circuit diagram illustrating a fuse unit.

FIG. 4A is a circuit diagram illustrating the fuse unit. Referring to FIG. 4A, the fuse unit includes a fuse voltage supplying unit 410 for supplying a high voltage VIN_H and a low voltage VIN_L for changing the electrical resistance of the anti-fuse 420 in response to a fuse programming signal TM_PG, fuse voltage output nodes A and B for outputting fuse voltages VFUSE_H and VFUSE_L which correspond to the electrical resistance of the anti-fuse 420, and a fuse state latching unit 430 for latching the fuse state signal FUSE_OUT which corresponds to the electrical connection state of the anti-fuse 420 in response to a reset signal RESETB and fuse programming signals TM_PG and TM_PGB.

Also, the fuse voltage output nodes include a first fuse voltage output node A connected between a high voltage supplier 411 and the anti-fuse 420 for outputting a first fuse voltage VFUSE_H which corresponds to the electrical resistance of the anti-fuse 420; and a second fuse voltage output node B connected between a low voltage supplier 412 and the anti-fuse 420 for outputting a second fuse voltage VFUSE_L which corresponds to the electrical resistance of the anti-fuse 420.

An operation of the fuse unit constructed as above-mentioned is described as follows.

The fuse voltage supplying unit 410 supplies the high voltage VIN_H and the low voltage VIN_L for changing the electrical resistance of the anti-fuse 420 in response to the fuse programming signals TM_PG and TM_PGB. The anti-fuse 420 is generally manufactured as a capacitor. Programming the anti-fuse 420 is performed by destroying insulating layers of both terminals of the anti-fuse 420 by applying a high potential difference between both of the terminals for a specified time. If the insulating layer is destroyed, both terminals change to a short state from an open state, and the anti-fuse 420 can be treated not as the capacitor but as a resistor. Therefore, the anti-fuse 420 can have electrical resistance ranging from infinity to several kilo-ohms (k$\Omega$). Accordingly, it can be said that the anti-fuse 420 has a change in electrical resistance which depends on the applied bias voltage and bias time. The anti-fuse 420 is normally programmed to store the address information by using the two states, i.e., the short state and the open state which is a not-programmed state. The fuse voltage output nodes A and B output the first fuse voltage VFUSE_H and the second fuse voltage VFUSE_L which correspond to the electrical resistance of the anti-fuse 420. Herein, the first fuse voltage VFUSE_H and the second fuse voltage VFUSE_L are generated according to the electrical resistance that the anti-fuse 420 has when the anti-fuse 420 is changed to the short state and the electrical resistance of switch elements for supplying a voltage at the high voltage supplier 411 and the low voltage supplier 412.

The monitoring circuit is operated differently in a programming mode and a normal mode according to the fuse programming signal TM_PG, and the fuse state latching unit 430 is also operated according to the two modes. In case that the anti-fuse 420 is not programmed in the normal mode, the reset signal RESETB is activated for a given time so that the first fuse voltage output node A keeps a logic high level. Since the anti-fuse 420 is in the open state even when the reset signal RESETB is deactivated, the first fuse voltage output node A continuously keeps the high level by the latch 431 and the fuse state signal FUSE_OUT is outputted as a logic low level. Since the anti-fuse 420 is in the short state when the anti-fuse 420 is programmed, the first fuse voltage output node A keeps the high level only when the reset signal RESETB is activated, and if the reset signal RESETB becomes deactivated, the first fuse voltage output node A is changed to the low level and the fuse state signal FUSE_OUT is outputted as the high level. The anti-fuse 420 is applied with the high voltage VIN_H and the low voltage VIN_L in the programming mode. Herein, for the high voltage VIN_H supplied to the anti-fuse 420 not be influenced by a feedback of the latch 431 while the programming is progressed, the feedback output of the latch 431 enters a high impedance (HI-Z) state when the fuse programming signal TM_PG is activated.

Figure 4B:
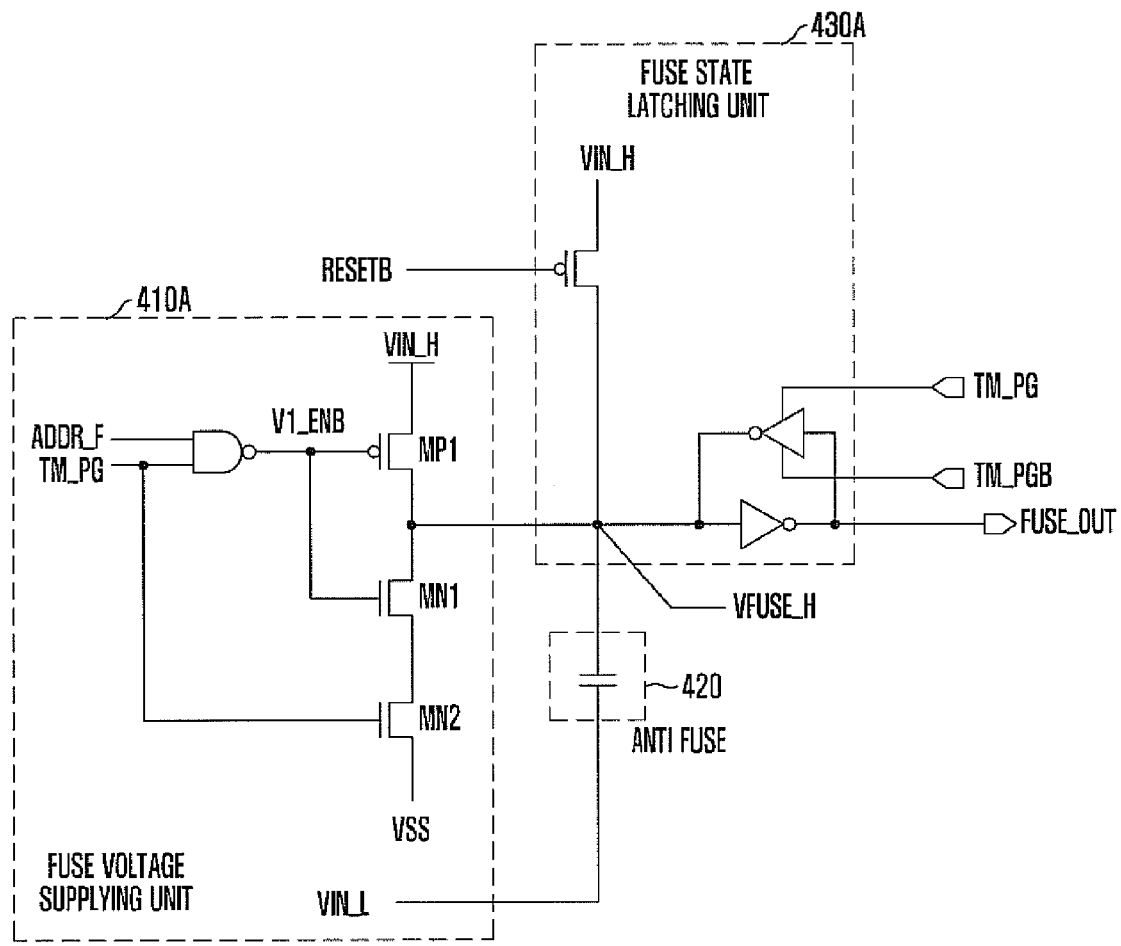
FIG. 4B is another circuit diagram depicting the fuse unit.

FIG. 4B is another circuit diagram depicting the fuse unit. Referring to FIG. 4B, the fuse unit includes a fuse voltage supplying unit 410A for supplying a high voltage VIN_H and a low voltage VIN_L for changing the electrical resistance of the anti-fuse 420 in response to a fuse programming signal TM_PG and a fuse address ADDR_F, a fuse voltage output node A for outputting a fuse voltage VFUSE_H which corresponds to the electrical resistance of the anti-fuse 420, and a fuse state latching unit 430A for latching the fuse state signal FUSE_OUT which corresponds to the electrical connection state of the anti-fuse 420 in response to a reset signal RESETB and the fuse programming signal TM_PG.

An operation of the fuse unit constructed as mentioned above is basically the same as that in the embodiment of the fuse unit shown in FIG. 4A. However, the fuse address ADDR_F for selecting an anti-fuse is additionally applied to the fuse voltage supplying unit 410A since the programming should be performed by selecting an anti-fuse in case that a plurality of anti-fuses for monitoring are included. When the fuse programming signal TM_PG is activated as the high level and the fuse address ADDR_F is not activated as the low level, a fuse voltage driving signal V1_ENB is deactivated as the high level so that a first PMOS transistor MP1 is turned-off and a first NMOS transistor MN1 and a second NMOS transistor MN2 are turned-on. Accordingly, the fuse unit is operated in a programming idle mode which is a step prior to the one in which the fuse unit is operated in the programming mode. When the fuse address ADDR_F is activated as the high level in the programming idle mode, the fuse voltage driving signal V1_ENB is activated as the low level so that the first PMOS transistor MP1 is turned-on and the fuse unit is operated in the programming mode. Also, in case that the fuse programming signal TM_PG is deactivated, the fuse voltage driving signal V1_ENB is deactivated regardless of the fuse address ADDR_F so that the first PMOS transistor MP1 is turned-off and the second NMOS transistor MN2 is also turned-off. Accordingly, the high voltage VIN_H is prevented from being supplied to the anti-fuse 420 and the fuse unit is operated in the normal mode. Furthermore, detailed explanations of the above-mentioned fuse unit are omitted here for avoiding overlapped explanations with FIG. 3.

Also, the reference voltage generating unit 20A is explained in detail as follows.

The reference voltage generating unit 20A is provided with a plurality of reference voltage generators 21 to 24 for generating the plurality of reference voltages VREF1 to VREF4.

Figure 5A:
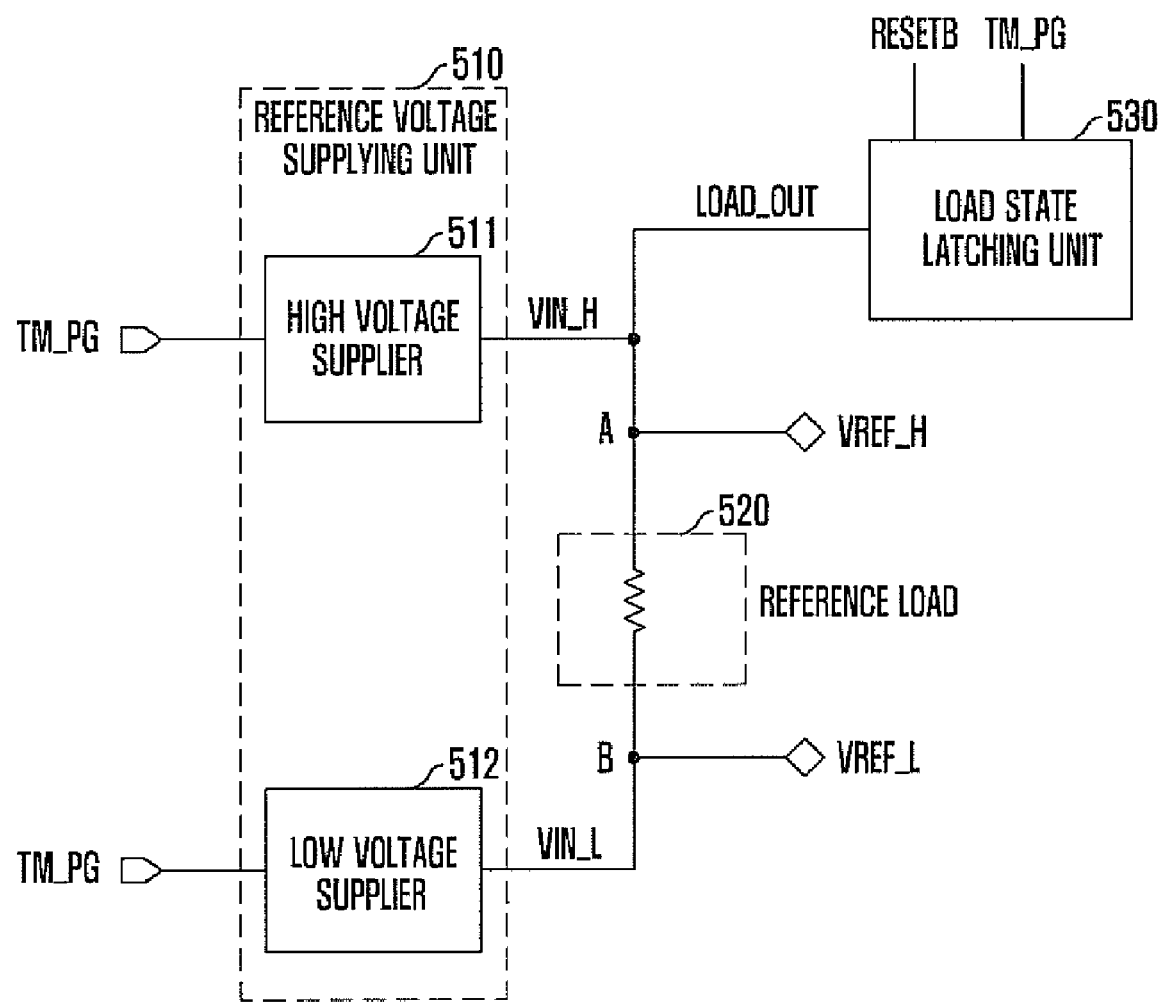
FIG. 5A is a circuit diagram illustrating a reference voltage generator.

FIG. 5A is a circuit diagram illustrating the reference voltage generator.

Referring to FIG. 5A, the reference voltage generator includes a reference voltage supplying unit 510 for supplying the high voltage VIN_H and the low voltage VIN_L to the reference load 520 in response to the fuse programming signals TM_PG and TM_PGB, reference voltage output nodes A and B for outputting reference voltages VREF_H and VREF_L which correspond to the electrical resistance of the reference load 520, and a load state latching unit 530 for latching a load state signal LOAD_OUT which corresponds to the electrical state of the reference load 520 in response to the reset signal RESETB and the fuse programming signal TM_PG.

Also, the reference voltage output nodes include a first reference voltage output node A connected between a high voltage supplier 511 and the reference load 520 for outputting a first reference voltage VREF_H which corresponds to the electrical resistance of the reference load 520, and a second reference voltage output node B connected between a low voltage supplier 512 and the reference load 520 for outputting a second reference voltage VREF_L which corresponds to the electrical resistance of the reference load 520.

An operation of the reference voltage generator constructed as mentioned above is described as follows.

The reference voltage supplying unit 510 supplies the high voltage VIN_H and the low voltage VIN_L to the reference load 520 in response to the fuse programming signal TM_PG. Herein, the reference voltage supplying unit 510 generally supplies the same voltage as a voltage supplied to the anti-fuse for detecting the electrical resistance of the anti-fuse. The reference voltage output nodes A and B output the first reference voltage VREF_H and the second reference voltage VREF_L which correspond to the electrical resistance of the reference load 520. Herein, the first reference voltage VREF_H and the second reference voltage VREF_L are generated according to a fixed electrical resistance of the reference load 520 and an electrical resistance of switch elements for supplying a voltage to the high voltage supplier 511 and the low voltage supplier 512. As mentioned above, it is desirable that an element whose electrical resistance is not changed in spite of an applied electrical stress is used as the reference load 520. The load state latching unit 530 latches the load state signal LOAD_OUT which corresponds to the electrical state of the reference load 520 in response to the reset signal RESETB and the fuse programming signals TM_PG and TM_PGB. The load state latching unit 530 is included corresponding to the fuse state latching unit to be configured with the same construction as the fuse unit. As mentioned above, it is desirable that all the parts of the fuse unit and the reference voltage generator are configured with elements which have the same construction and electrical characteristics except for the anti-fuse and the reference load.

Figure 5B:
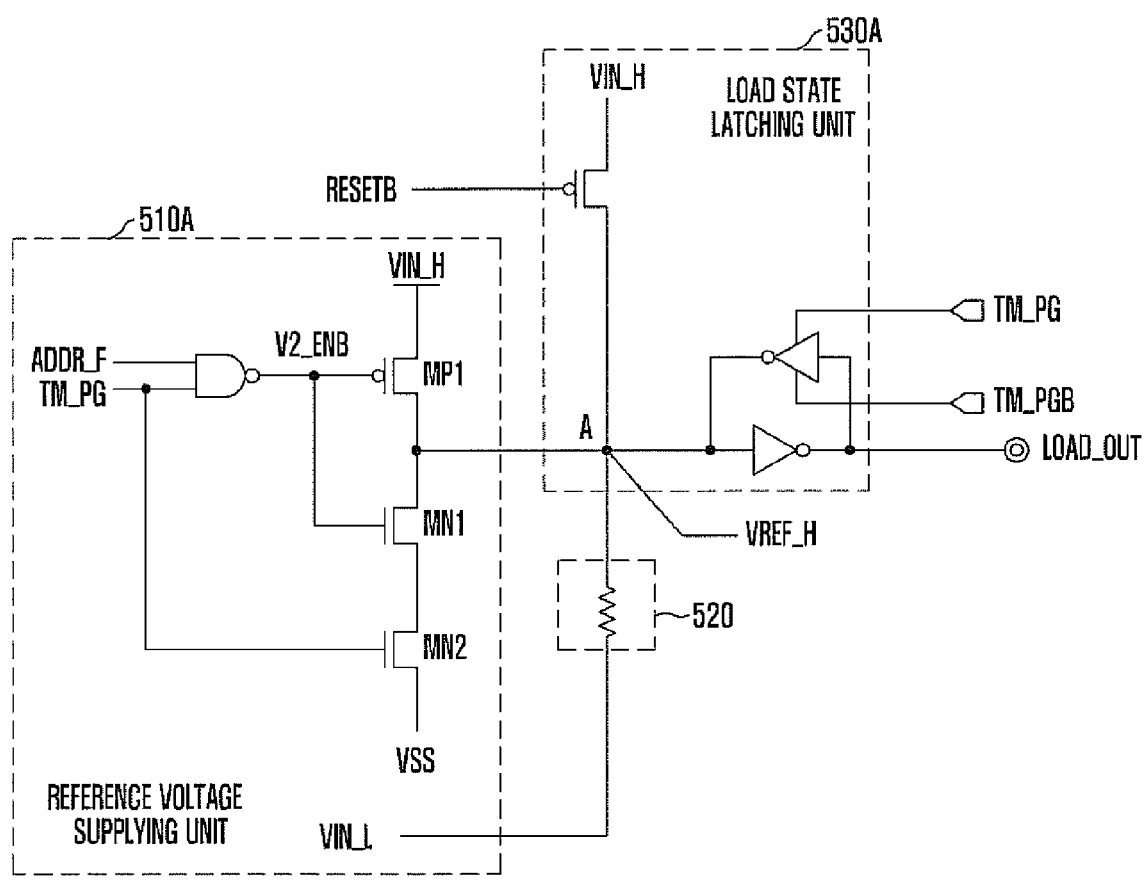
FIG. 5B is another circuit diagram illustrating the reference voltage generator.

FIG. 5B is another circuit diagram illustrating the reference voltage generator.

Referring to FIG. 5B, the reference voltage generator includes a reference voltage supplying unit 510A for supplying the high voltage VIN_H and the low voltage VIN_L to the reference load 520 in response to the fuse programming signal TM_PG and the fuse address ADDR_F; a reference voltage output node A for outputting a reference voltage VREF_H which correspond to the electrical resistance of the reference load 520, and a load state latching unit 530A for latching a load state signal LOAD_OUT which corresponds to the electrical state of the reference load 520 in response to the reset signal RESETB and the fuse programming signals TM_PG and TM_PGB.

An operation of the reference voltage generator constructed as above-mentioned is basically the same to that of the reference voltage generator shown in FIG. 5A. However, an anti-fuse should be selected for the programming in case that a plurality of anti-fuses for monitoring are included. Accordingly, the reference voltage generator included for detecting the electrical resistance of the anti-fuse is also additionally applied with the fuse address ADDR_F to be operated. It is possible that the above-mentioned reference voltage generator can be included together with the fuse unit shown in FIG. 4B for constructing the monitoring circuit.

Also, the comparing unit 30A is explained in detail as follows.

Figure 6A:
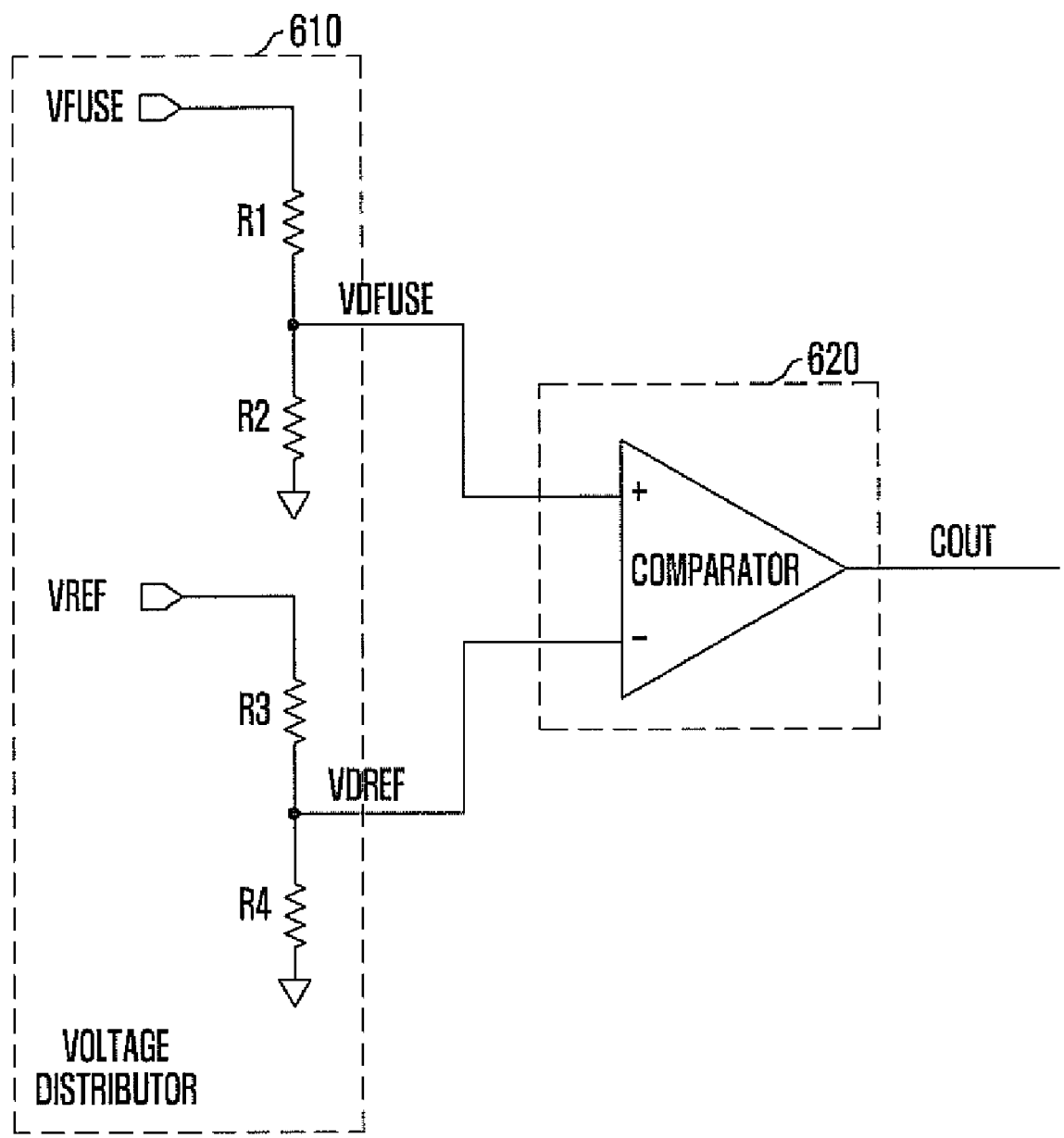
FIG. 6A is a circuit diagram showing a comparator.

FIG. 6A is a circuit diagram showing the comparator and it is described on FIGS. 4A and 5A. The comparator 620 outputs the load detection signal COUT by comparing the fuse voltage VFUSE and the reference voltage VREF. The comparator 620 can output the load detection signal COUT by comparing the first fuse voltage VFUSE_H with the first reference voltage VREF_H or comparing the second fuse voltage VFUSE_L with the second reference voltage VREF_L. Herein, according to the voltage level of an applied signal, an appropriate method can be used. Also, for improving an operational performance of the comparator 620, a voltage distributor 610 can be further included for distributing a voltage of the applied signal. The voltage distributor 610 redistributes a signal applied through a plurality of resistors R1 and R2 or R3 and R4 connected in series to input the redistributed signal into the comparator 620.

TABLE 1

| Range of electrical | Output of comparator | | | |
|---|---|---|---|---|
| resistance | COUT1 | COUT2 | COUT3 | COUT4 |
| More than 500 kΩ | 1 | 1 | 1 | 1 |
| 100 kΩ~500 kΩ | 1 | 1 | 1 | 0 |
| 50 kΩ~100 kΩ | 1 | 1 | 0 | 0 |
| 10 kΩ~50 kΩ | 1 | 0 | 0 | 0 |
| Less than 10 kΩ | 0 | 0 | 0 | 0 |

Table. 1 shows an output of the comparator according to a change of the electrical resistance of the anti-fuse.

Referring to Table. 1, a result of comparing the reference voltage generator differentiated by four different electrical resistances with an output of the fuse unit provided with the anti-fuse is shown. The range of the electrical resistance is classified into five groups on the basis of four electrical resistances, and the load detection signals COUT1 to COUT4 outputted from the comparator are outputted according to the change of the electrical resistance of the anti-fuse as shown in Table. 1.

Figure 6B:
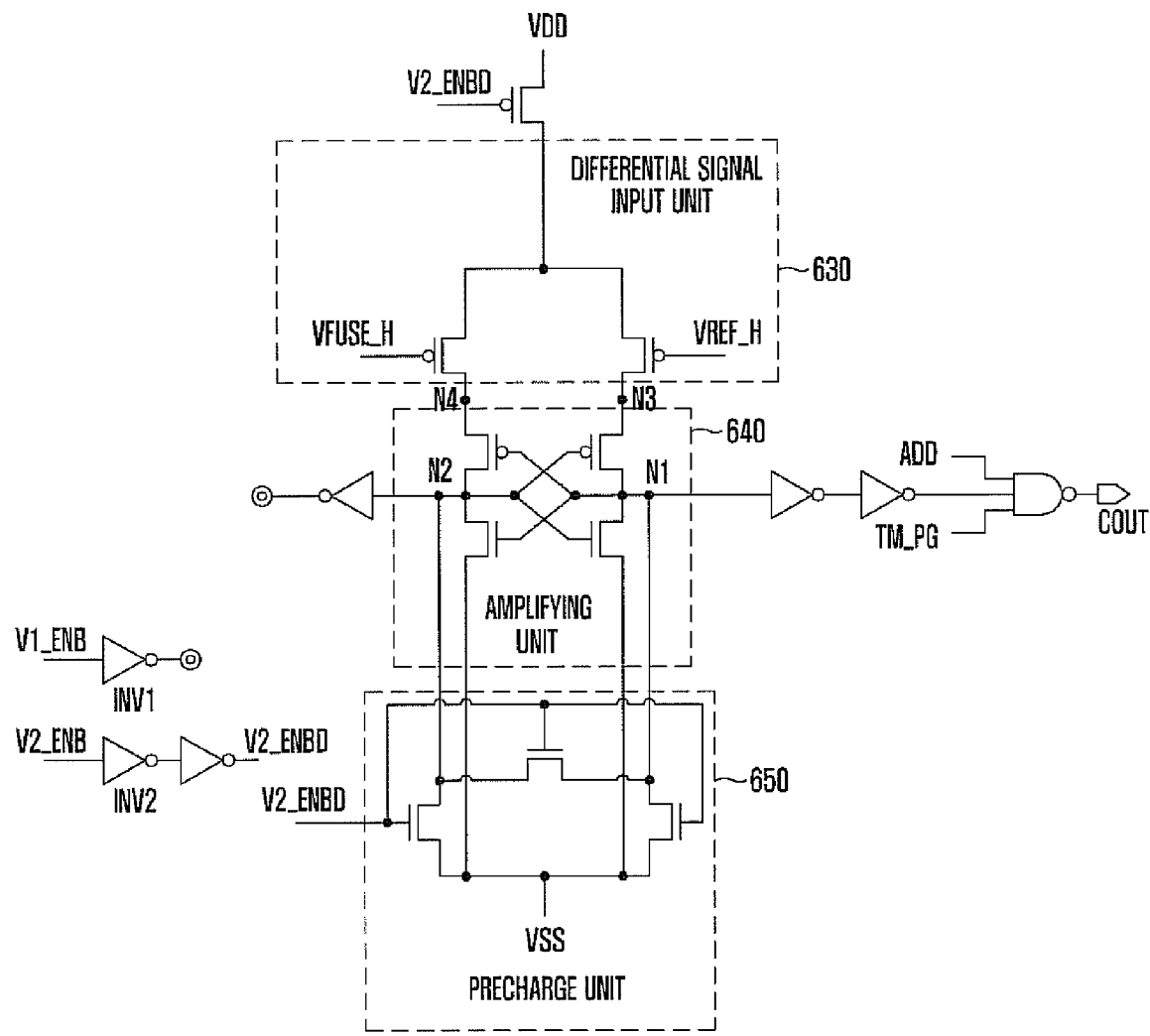
FIG. 6B is another circuit diagram illustrating the comparator.

FIG. 6B is another circuit diagram illustrating the comparator.

Referring to FIG. 6B, the comparator is a cross-coupled type differential amplifier including a differential signal input unit 630 connected between a power supply voltage VDD and first and second nodes N3 and N4 for receiving differential signals VFUSE_H and VREF_H; an amplifying unit 640 connected between a ground voltage VSS and the first and second nodes N3 and N4; and a precharge unit 650 connected between first and second output nodes N1 and N2 of the amplifying unit 640 and the ground voltage VSS. Herein, the comparator can be constructed by using a general differential amplifying circuit and a cross-coupled type differential amplifier, according to one embodiment.

An operation of the comparator constructed as mentioned above is described as follows referring to FIGS. 4B and 5B.

The differential signal input unit 630 is connected between the power supply voltage VDD and the amplifying unit 640 and receives the fuse voltage VFUSE_H and the reference voltage VREF_H as a differential signal. The amplifying unit 640 amplifies a signal according to a differential signal applied from the differential signal input unit 630 and outputs the amplified signal through the first output node N1 and the second output node N2. When the monitoring circuit is operated in the programming idle mode or the normal mode, a reference voltage driving signal V2_ENBD is deactivated as the high level and thus the power supply voltage VDD is prevented from being applied to the differential signal input unit 630, and the precharge unit 650 precharges the first and second output nodes N1 and N2 so that the comparing operation is not performed. At this time, the load detection signal COUT is outputted as the high level. Also, when the monitoring circuit is operated in the programming mode, the reference voltage driving signal V2_ENBD is activated as the low level and thus the power supply voltage VDD is applied to the differential signal input unit 630, and the precharge unit 650 stops the precharge of the first and second output nodes N1 and N2 so that the comparing operation is performed.

Since the fuse voltage VFUSE_H is higher than the reference voltage VREF_H in case that the anti-fuse is not ruptured, the load detection signal is outputted as the low level. If the anti-fuse is ruptured so that the fuse voltage VFUSE_H becomes lower than the reference voltage VREF_H, the load detection signal COUT is outputted as the high level. That is, at the timing when the load detection signal COUT is changed from the low level to the high level, it can be monitored that the electrical resistance of the anti-fuse becomes smaller than the electrical resistance of the reference load which generates the fuse voltage VFUSE_H. Accordingly, by comparing a plurality of reference voltages which are different from each other with the fuse voltage VFUSE_H, the range of the electrical resistance change of the anti-fuse can be more precisely detected. For reference, an inverter INV1 is coupled to the fuse voltage driving signal V1_ENB in FIG. 6B for equalizing the electrical resistances of parts through which the reference voltage driving signal V2_ENB and the fuse voltage driving signal V1_ENB are inputted.

Also, the output units 40A and 40B are explained in detail as follows.

Figure 7A:
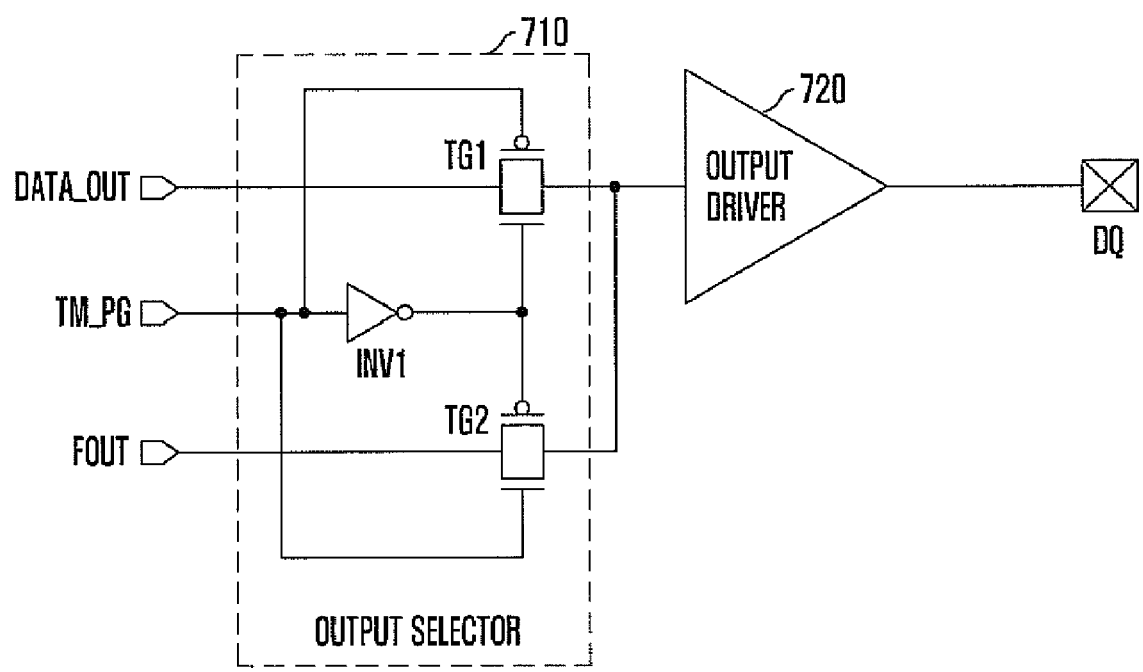
FIG. 7A is a circuit diagram depicting an output unit.

FIG. 7A is a circuit diagram depicting the output unit. Referring to FIG. 7A, the output unit includes an output selector 710 provided with a firs transmission gate TG1 controlled by the fuse programming signal TM_PG for selectively outputting an output data signal DATA_OUT and a second transmission gate TG2 controlled by the fuse programming signal TM_PG for selectively outputting the buffered load detection signal FOUT; and an output driver 720 for driving the data output pad DQ. According to whether the fuse programming signal TM_PG is activated or not, the output selector 710 selectively outputs the output data signal DATA_OUT or the load detection signal FOUT and the output driver 720 drives the data output pad DQ to output the load detection signal FOUT to the outside of the semiconductor device.

Figure 7B:
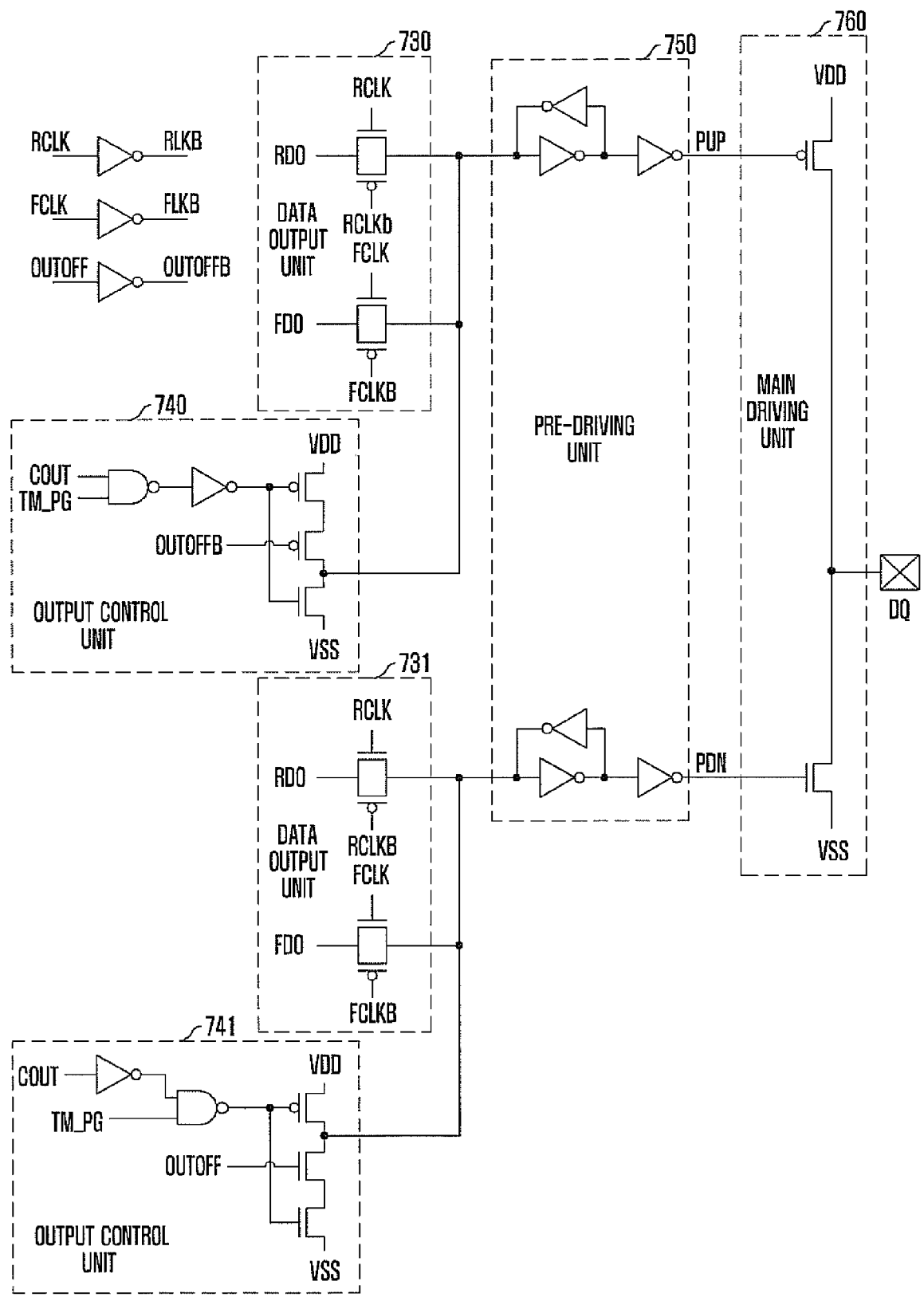
FIG. 7B is another circuit diagram depicting the output unit.

FIG. 7B is another circuit diagram depicting the output unit. Referring to FIG. 7B, the output unit includes data output units 730 and 731 for outputting output data signals RD0 and FD0 in response to clock signals RCLK and FCLK, output control units 740 and 741 for outputting the load detection signal COUT in response to output control signals OUTOFF and OUTOFFB and the fuse programming signal TM_PG, a pre-driving unit 750 for generating a pull-up driving signal PUP and a pull-down driving signal PDN which correspond to a signal outputted from the data output units 730 and 731 or a signal outputted from the output control units 740 and 741, and a main driving unit 760 for driving the data output pad DQ in response to the pull-up driving signal PUP and the pull-down driving signal PDN.

An operation of the output unit constructed as mentioned above is described as follows.

When the output control signal OUTOFF and the fuse programming signal TM_PG are deactivated as the low level, the output data signals RD0 and FD0 are outputted to the data output pad DQ through the pre-driving unit 750 and the main driving unit 760. When the output control signal OUTOFF is activated as the high level and the fuse programming signal TM_PG is deactivated as the low level, the data output pad DQ enters the high impedance (HI-Z) state and thus enters the off state. Also, when the output control signal OUTOFF and the fuse programming signal TM_PG are activated as the high level, the load detection signal COUT is transferred through the pre-driving unit 750 to be outputted to the data output pad DQ from the main driving unit 760.

Detailed explanations of the monitoring circuit of the semiconductor device have been described in accordance with the embodiment of the present invention. While the spirit of the present invention has been specifically described in accordance with the above-mentioned desirable embodiment, it should be noticed that the above-mentioned embodiment is for explaining the present invention not for limiting it. Also, those who skilled in the art can understand that various embodiments may be possible within the scope of the spirit of the present invention.

For instance, while four reference voltages are generated to be compared with the fuse voltage or the load voltage in the above-mentioned embodiment, the number of the reference voltage can be changed according to the range of the electrical resistance expected to be detected and the precision, and it is also possible that the electrical resistance can be detected by using only a single reference voltage. Furthermore, the monitored signal can be outputted by using an extra output pad of the semiconductor device instead of the data output pad DQ, and the configuration of the active high or the active low for showing the activation of a signal can be changed according to an embodiment. Furthermore, the present invention can be adopted for monitoring the electrical resistance of various elements whose electrical characteristics is changed even though those are not fuses. Finally, the configuration of the transistor can be modified for embodying the same function according to the need. That is, the configuration of the PMOS transistor can be replaced with the NMOS transistor and various transistors according to the need. Since, such cases of modifications of the circuit are numerous and those who skilled in the art can easily know by analogy, the enumeration of them has been omitted.

In accordance with the present invention, a change of the electrical resistance of an element such as a fuse can be detected not only while the element is being programmed, but also even after the element has been programmed so that the optimum condition for the program can be detected. Furthermore, since the programming can be performed collectively by using the detected optimum condition, the efficiency of the programming operation can be raised. The present invention can, also, assure precision development of a product which uses such an element and raise the stability of an operation of the product. Furthermore, since the detected electrical resistance can be outputted to the outside through the output pad, it is highly efficient to monitor the semiconductor device of the package form.

While the present invention has been described with respect to the specific embodiments, it will be apparent to those skilled in the art that various changes and modifications may be made without departing from the spirit and scope of the invention as defined in the following claims.

What is claimed is:

1. A monitoring circuit of a semiconductor device, comprising:
 a fuse unit including an anti-fuse, an electrical resistance of the anti-fuse changing according to an applied electrical stress, configured to output a fuse voltage corresponding to said electrical resistance, and a fuse state signal corresponding to an electrical connection state of the anti-fuse;
 a reference voltage generating unit configured to generate a reference voltage;
 a comparing unit which, in response to a change of said electrical resistance, compares the fuse voltage with the reference voltage and outputs a load detection signal based on a result of the comparison; and
 an output unit configured to output the load detection signal and the fuse state signal to an output pad,
 wherein the reference voltage generating unit generates a plurality of reference voltages, the comparing unit outputs a load detection signal for each of the plurality of reference voltages, and the output unit outputs the load detection signal for each of the plurality of reference voltages and the fuse state signal to the output pad,
 wherein the reference voltage generating unit includes a plurality of reference loads whose electrical resistance does not change with respect to an applied electrical stress, and a plurality of reference voltage generators for generating the plurality of reference voltages, wherein each reference voltage generator includes one of the plurality of the reference loads, generates a reference voltage corresponding to the electrical resistance of the one reference load, and each of the plurality of reference loads has a different electrical resistance, and
 wherein the fuse unit includes:
 a fuse voltage supplying unit which, in response to a fuse programming signal, supplies a high voltage and a low voltage for changing the electrical resistance of the anti-fuse;
 a fuse voltage output unit configured to output the fuse voltage corresponding to the electrical resistance of the anti-fuse; and
 a fuse state latching unit which, in response to a reset signal and the fuse programming signal, latches the fuse state signal corresponding to the electrical connection state of the anti-fuse.

2. The monitoring circuit of claim 1, wherein each of the plurality of reference voltage generators includes:
   a reference voltage supplying unit which, in response to the fuse programming signal, supplies a high voltage and a low voltage to the reference load included in the reference voltage generator;
   a reference voltage output unit configured to output a reference voltage corresponding to the electrical resistance of the reference load; and
   a load state latching unit which, in response to the reset signal and the fuse programming signal, latches a load state signal corresponding to an electrical connection state of the reference load.

3. The monitoring circuit of claim 2, wherein the fuse unit and the plurality of reference voltage generators only differ in the anti-fuse of the fuse unit and the reference loads of the reference voltage generators.

4. The monitoring circuit of claim 2, wherein the fuse voltage output unit includes:
   a first fuse voltage output node, connected between the high voltage supplied from the fuse voltage supplying unit and the anti-fuse, configured to output a first fuse voltage corresponding to the electrical resistance of the anti-fuse; and
   a second fuse voltage output node, connected between the low voltage supplied from the fuse voltage supplying unit and the anti-fuse, configured to output a second fuse voltage corresponding to the electrical resistance of the anti-fuse.

5. The monitoring circuit of claim 4, wherein the reference voltage output unit includes:
   a first reference voltage output node, connected between the high voltage supplied from the reference voltage supplying unit and the reference load, configured to output a first reference voltage corresponding to the electrical resistance of the reference load; and
   a second reference voltage output node, connected between the low voltage supplied from the reference voltage supplying unit and the reference load, configured to output a second reference voltage corresponding to the electrical resistance of the reference load.

6. The monitoring circuit of claim 5, wherein the comparing unit includes a plurality of comparators, each comparing the first fuse voltage with each of the plurality of first reference voltages or comparing the second fuse voltage with each of the plurality of second reference voltages.

7. The monitoring circuit of claim 6, wherein each of the plurality of comparators further includes a voltage distributor configured to distribute a voltage of an applied signal.

8. The monitoring circuit of claim 7, wherein the voltage distributor includes a plurality of loads connected in series for distributing the voltage of the applied signal.

9. The monitoring circuit of claim 6, wherein each of the plurality of comparators further includes a differential amplifying circuit.

10. The monitoring circuit of claim 9, wherein the differential amplifying circuit includes:
    a differential signal input unit, connected between a power supply voltage and both a first node and a second node, configured to receive a differential signal;
    an amplifying unit connected between a ground voltage and both the first and the second nodes; and
    a pre-charge unit connected between both a first output node and a second output node of the amplifying unit and the ground voltage.

11. The monitoring circuit of claim 6, wherein the output unit includes:
    a buffer unit configured to buffer the plurality of load detection signals and the fuse state signal;
    an output selection unit which, in response to the fuse programming signal, selectively outputs an output data signal or a signal outputted from the buffer unit; and
    an output driving unit configured to output a signal outputted from the output selection unit to a data output pad.

12. The monitoring circuit of claim 11, wherein the buffer unit further includes a selector which, in response to a selection signal, selectively outputs the plurality of detection signals or the fuse state signal.

13. The monitoring circuit of claim 11, wherein the output selection unit includes:
    a plurality of first transmission gates configured to selectively output the output data; and
    a plurality of second transmission gates configured to selectively output a signal outputted from the buffer.

14. The monitoring circuit of claim 9, wherein the output unit includes:
    a data output unit which, in response to a clock signal, outputs an output data signal;
    an output control unit which, in response to an output control signal and the fuse programming signal, outputs a signal outputted from the plurality of comparators;
    a pre-driving unit configured to generate a pull-up driving signal and a pull-down driving signal corresponding to a signal outputted from the data output unit or a signal outputted from the output control unit; and
    a main driving unit which, in response to the pull-up driving signal and the pull-down driving signal, drives a data output pad.

* * * * *